(12) United States Patent
Lim

(10) Patent No.: US 10,115,715 B2
(45) Date of Patent: Oct. 30, 2018

(54) METHODS OF MAKING SEMICONDUCTOR DEVICE PACKAGES AND RELATED SEMICONDUCTOR DEVICE PACKAGES

(71) Applicant: Micron Technology, Inc., Boise, ID (US)

(72) Inventor: Thiam Chye Lim, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/602,759

(22) Filed: May 23, 2017

(65) Prior Publication Data

US 2017/0256528 A1 Sep. 7, 2017

Related U.S. Application Data

(63) Continuation of application No. 14/792,970, filed on Jul. 7, 2015, now Pat. No. 9,673,183.

(51) Int. Cl.
*H01L 23/49* (2006.01)
*H01L 23/488* (2006.01)
(Continued)

(52) U.S. Cl.
CPC ............ *H01L 25/18* (2013.01); *H01L 21/565* (2013.01); *H01L 21/78* (2013.01); *H01L 23/3107* (2013.01); *H01L 23/49827* (2013.01); *H01L 23/49838* (2013.01); *H01L 24/06* (2013.01); *H01L 24/49* (2013.01); *H01L 24/85* (2013.01); *H01L 24/97* (2013.01); *H01L 25/0657* (2013.01); *H01L 25/105* (2013.01); *H01L 25/50* (2013.01); *H01L 23/3128* (2013.01); *H01L 24/48* (2013.01); *H01L 25/0655* (2013.01); *H01L 2224/04042* (2013.01); *H01L 2224/32145* (2013.01); *H01L 2224/48145* (2013.01);
(Continued)

(58) Field of Classification Search
CPC ..... H01L 25/18; H01L 25/50; H01L 25/0657; H01L 21/78; H01L 21/565; H01L 23/3107; H01L 23/49827; H01L 23/49838; H01L 24/06; H01L 24/49; H01L 24/85; H01L 24/97
USPC ................ 257/686, 774, 777, 786, E23.172, 257/E23.178, E25.013, E25.023, E21.499, 257/E21.597; 438/107, 109, 110, 667
See application file for complete search history.

(56) References Cited

U.S. PATENT DOCUMENTS 6,376,904 B1 * 4/2002 Haba .................. H01L 23/3128
174/541
7,259,451 B2 8/2007 Seng et al.
(Continued)

*Primary Examiner* — Dao H Nguyen
(74) *Attorney, Agent, or Firm* — TraskBritt

(57) ABSTRACT

Methods of fabricating a semiconductor device package may involve providing a fan out wafer including semiconductor-device-package locations at a base level. Laterally offset semiconductor dice may be stacked at least some semiconductor-device-package locations of the fan out wafer to expose bond pads at a lateral periphery of each of the laterally offset semiconductor dice. The laterally offset semiconductor dice may be electrically connected to one another and associated electrically conductive traces of the at least some semiconductor-device-package locations. The semiconductor-device-package locations having stacks of semiconductor dice thereon may be singulated from the fan out wafer.

20 Claims, 7 Drawing Sheets

(51) Int. Cl.
*H01L 21/50* (2006.01)
*H01L 25/00* (2006.01)
*H01L 25/18* (2006.01)
*H01L 23/00* (2006.01)
*H01L 23/498* (2006.01)
*H01L 21/56* (2006.01)
*H01L 21/78* (2006.01)
*H01L 25/065* (2006.01)
*H01L 23/31* (2006.01)
*H01L 25/10* (2006.01)

(52) U.S. Cl.
CPC ............... *H01L 2224/48235* (2013.01); *H01L 2224/73265* (2013.01); *H01L 2225/0651* (2013.01); *H01L 2225/06506* (2013.01); *H01L 2225/06548* (2013.01); *H01L 2225/06562* (2013.01); *H01L 2225/06565* (2013.01); *H01L 2225/1035* (2013.01); *H01L 2924/00014* (2013.01); *H01L 2924/14* (2013.01); *H01L 2924/143* (2013.01); *H01L 2924/1434* (2013.01)

(56) References Cited

U.S. PATENT DOCUMENTS

| | | |
|---|---|---|
| 7,781,877 B2 | 8/2010 | Jiang et al. |
| 8,076,788 B2 | 12/2011 | Haba et al. |
| 8,368,231 B2 | 2/2013 | Lee et al. |
| 8,389,333 B2 | 3/2013 | Camacho |
| 8,524,577 B2 | 9/2013 | Phua et al. |
| 8,664,780 B2 * | 3/2014 | Han ................... H01L 21/561 257/678 |
| 9,773,766 B2 * | 9/2017 | Ye ........................ H01L 25/00 |
| 2005/0046002 A1 | 3/2005 | Lee et al. |
| 2007/0023887 A1 | 2/2007 | Matsui |
| 2007/0035015 A1 | 2/2007 | Hsu |
| 2009/0039523 A1 | 2/2009 | Jiang et al. |
| 2009/0239336 A1 | 9/2009 | Lee et al. |
| 2009/0243045 A1 | 10/2009 | Pagaila et al. |
| 2010/0320585 A1 | 12/2010 | Jiang et al. |
| 2011/0115100 A1 * | 5/2011 | Okumura ............... H01L 24/48 257/782 |
| 2011/0266692 A1 | 11/2011 | Sasaki et al. |
| 2012/0211892 A1 | 8/2012 | Kim et al. |
| 2013/0078763 A1 * | 3/2013 | Lee ........................ H01L 24/24 438/107 |
| 2013/0119559 A1 | 5/2013 | Camacho |
| 2014/0134798 A1 * | 5/2014 | Kim ....................... H01L 24/19 438/109 |
| 2016/0035698 A1 * | 2/2016 | Lee .................... H01L 25/0652 257/777 |
| 2016/0225431 A1 * | 8/2016 | Best ........................ G11C 5/02 |
| 2017/0012031 A1 | 1/2017 | Lim |
| 2017/0125378 A1 * | 5/2017 | Park ........................ H01L 24/32 |

* cited by examiner

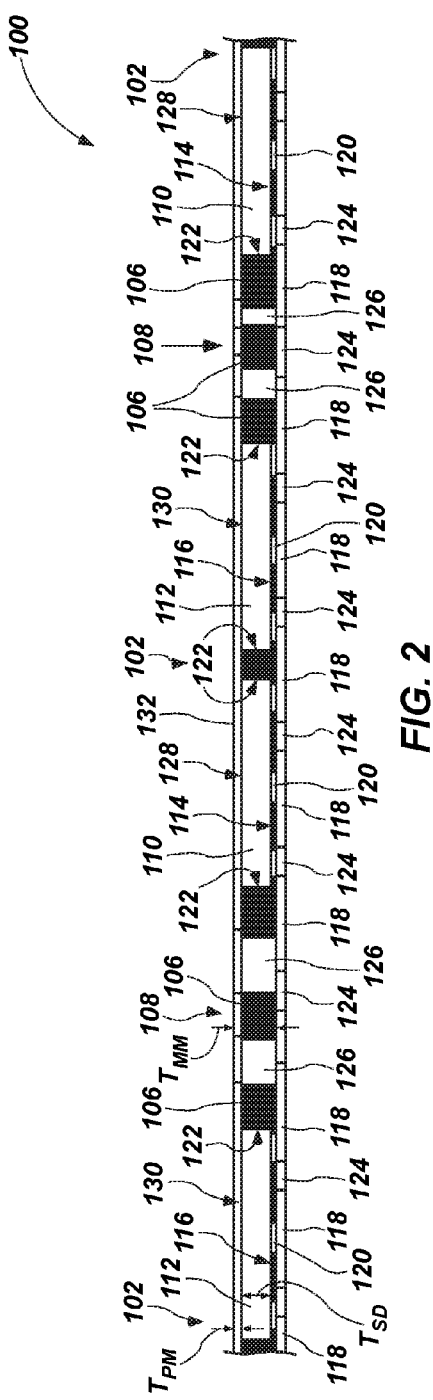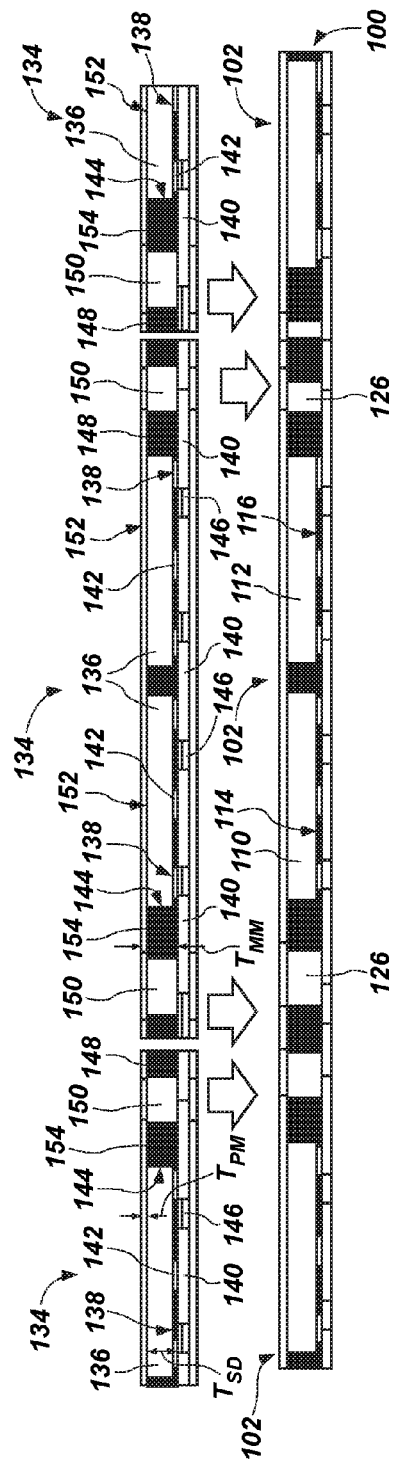
FIG. 2
FIG. 3

METHODS OF MAKING SEMICONDUCTOR DEVICE PACKAGES AND RELATED SEMICONDUCTOR DEVICE PACKAGES

CROSS-REFERENCE TO RELATED APPLICATION

This application is a continuation of U.S. patent application Ser. No. 14/792,970, filed Jul. 7, 2015, now U.S. Pat. No. 9,673,183, issued Jun. 6, 2017, the disclosure of which is hereby incorporated herein in its entirety by this reference.

FIELD

This disclosure relates generally to semiconductor device packages and methods of making semiconductor device packages. More specifically, disclosed embodiments relate to semiconductor device packages and methods of making semiconductor device packages that may exhibit reduced height, reduce manufacturing and component complexity, and improve thermal management.

BACKGROUND

Semiconductor wafers including die locations on their active surfaces may be relatively thin and brittle, lacking any substantial strength, particularly against bending stresses, which may result from the use of such wafers in processes to fabricate and encapsulate stacked multi-die semiconductor packages. To mechanically support a semiconductor wafer, which may be characterized as a "base wafer," while individual semiconductor dice are stacked on these die locations to form multi-die semiconductor device assemblies, the semiconductor wafer may be attached to a carrier wafer or other physical support, for example, by positioning an attachment material, such as an adhesive, between the semiconductor wafer and the carrier wafer. Such a carrier wafer is also required due to the inability of wafer handling equipment to handle such a thin base wafer without damage. Subsequently, the active surface of the base wafer and laterally separated stacks of semiconductor dice thereon may be encapsulated in a protective material, for example, a dielectric molding material. After encapsulation, the carrier wafer may be detached from the semiconductor wafer. For example, the attachment material may be weakened by heating, and the semiconductor wafer and carrier wafer may be slid laterally relative to one another until the carrier wafer is removed. As another example, a laser may be used to heat and ablate the attachment material. As yet another example, a solvent may be used to dissolve portions of the attachment material, and the carrier wafer may be physically pulled away from the semiconductor wafer. Individual semiconductor device packages comprising the stacked, encapsulated semiconductor dice and a semiconductor die singulated from the semiconductor wafer may be formed by cutting through the protective material between the die stacks and through the semiconductor wafer along so-called "streets" between the die locations to "singulate" the semiconductor device packages from one another.

Such methods employing a carrier wafer supporting a base wafer can result in damage to the base wafer due to excessive wafer warpage resulting from the molding process employed to encapsulate a large number of die stacks on the base wafer. Further, debonding of a carrier wafer from the molded wafer assembly is costly and may also initiate damage. In addition, singulating the base wafer through the streets between die locations leaves semiconductor material exposed at the sides of the singulated die locations, and semiconductor material is also exposed at the side of the previously singulated semiconductor dice stacked on each die location prior to encapsulation by the dielectric molding material.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

FIG. 2 is a cross-sectional view of a portion of the fan out wafer of FIG. 1;

FIG. 3 is a cross-sectional view of the portion of the fan out wafer of FIG. 2 in a first stage of a process of making a semiconductor device package;

DETAILED DESCRIPTION

The illustrations presented in this disclosure are not meant to be actual views of any particular wafer, semiconductor device package, or component thereof or any particular act in a process of manufacturing a wafer, semiconductor device package, or component thereof, but are merely idealized representations employed to describe illustrative embodiments. Thus, the drawings are not necessarily to scale.

Disclosed embodiments relate generally to semiconductor device packages and methods of making semiconductor device packages that may exhibit reduced height, reduced manufacturing and component complexity, and improved thermal management. More specifically, disclosed are embodiments of apparatuses that may employ wafer-level manufacturing and may reduce the number of components and process steps to produce semiconductor device packages exhibiting reduced height, reduced manufacturing and component complexity, and improved thermal management.

As used herein, the term "laterally" means and includes directions parallel to active surfaces of semiconductor dice.

As used herein, the term "fan out wafer" means and includes substrates comprising individual semiconductor dice or groups of dice (i.e., wafer segments) previously singulated from a wafer or other bulk semiconductor substrate and laterally separated and mutually secured by another material, for example, a dielectric molding material. The dielectric material may only cover sides of the semiconductor dice or wafer segments, or may extend over inactive surfaces thereof, which may also be characterized as "back sides" of the dice or wafer segments. The term "fan out" itself characterizes the enhanced lateral spacing of semiconductor dice or wafer segments thereof comprising a wafer or other large-scale substrate by wide streets comprising the dielectric material, in comparison to die-to-die spacing of a wafer or wafers comprising only semiconductor material on which such semiconductor dice or wafer segments were fabricated initially. Fan out wafers may comprise only a single type and design of semiconductor dice, or may comprise multiple types, such as logic and power dice, or memory dice of different designs and types.

Figure 1:
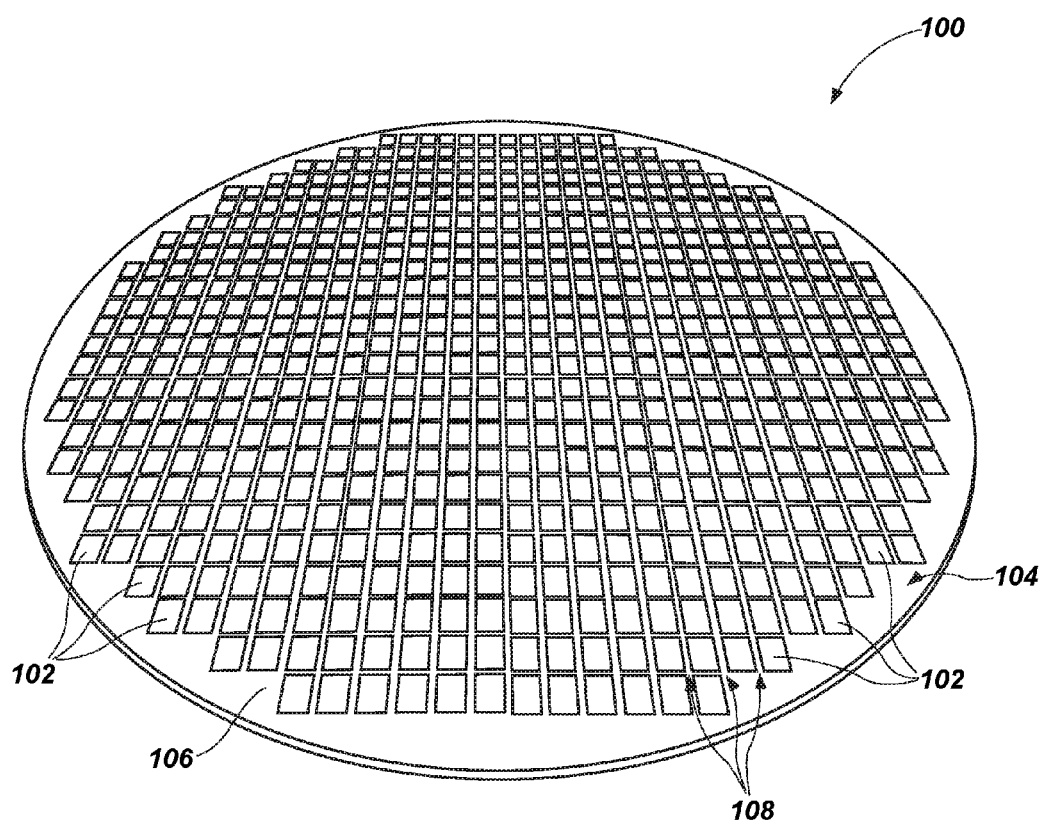
FIG. 1 is a perspective view of a fan out wafer.

Referring to FIG. 1, a perspective view of a fan out wafer 100 is shown. The fan out wafer 100 may include an array of semiconductor-device-package locations 102 distributed over a surface 104 of the fan out wafer 100. Each semiconductor-device-package location 102 comprises multiple semiconductor dice, and may be configured to receive and electrically connect to additional electronic components positioned thereon to form a semiconductor device package. The semiconductor-device-package locations 102 may be separated from one another by streets 108, which may form, for example, a grid of mutually perpendicular spaces devoid of integrated circuitry around and between the semiconductor-device-package locations 102. The semiconductor-device-package locations 102 may be mutually bound together by one or more materials of the fan out wafer 100 comprising streets 108. For example, the semiconductor-device-package locations 102 may be mutually separated and bound together by at least a dielectric molding material 106 of the fan out wafer 100.

The fan out wafer 100 may exhibit a, for example, substantially circular cross-sectional shape. More specifically, a periphery of the fan out wafer 100 may be generally circular when viewed from a top-down perspective in some embodiments. In other embodiments, the fan out wafer 100 may exhibit other cross-sectional shapes when viewed from the top-down perspective, such as, for example, oval, rectangle, polygonal, or irregular. The semiconductor-device-package locations 102 may be, for example, square or rectangular in shape when viewed from the top down. In some embodiments, each semiconductor-device-package location 102 may be the same in shape, structure, or shape and structure as each other semiconductor-device-package location 102. In other embodiments, the array may include semiconductor-device-package locations 102 of differing shape, structure, or shape and structure.

FIG. 2 is a cross-sectional view of a portion of the fan out wafer 100 of FIG. 1. The portion of the fan out wafer 100 of shown in FIG. 2 includes a full view of one semiconductor-device-package location 102 and partial views of laterally adjacent semiconductor-device-package locations 102. At least one semiconductor-device-package location 102 of the array of semiconductor-device-package locations 102 may include at least a first semiconductor die 110 and a second semiconductor die 112 laterally adjacent to and spaced from the first semiconductor die 110. More specifically, an active surface 114 of the first semiconductor die 110 may be at least substantially coplanar with an active surface 116 of the second semiconductor die 112. The active surfaces 114 and 116 of the first and second semiconductor dice 110 and 112 may include integrated circuitry, such as, for example, transistors, capacitors, resistors, etc. In some embodiments, the first semiconductor die 110 may be, for example, a logic device (e.g., a micro-controller), and the second semiconductor die 112 may be, for example, a power management device. In other embodiments, one or both of the first and second semiconductor dice 110 and 112 may be memory devices (e.g., DRAM or NAND Flash memory).

Dielectric material, such as a molding material 106 may laterally surround each of the first and second semiconductor dice 110 and 112, mutually separating first and second semiconductor dice 110 and 112 and separating these dice from adjacent semiconductor-device-package locations 102. The dielectric molding material 106 may be a dielectric material encapsulating at least the side surfaces 122, and optionally the inactive surfaces 128 and 130 of the first and second semiconductor dice 110 and 112. More specifically, the dielectric molding material 106 may be formed by flowing a curable molding material precursor at least laterally around the first and second semiconductor dice 110 and 112 at each semiconductor-device-package location 102, curing it to form the dielectric molding material 106 and bind the discrete semiconductor-device-package locations 102 together to form the fan out wafer 100. The semiconductor-device-package locations 102 may be formed, for example, by singulating individual semiconductor-device-package locations 102 each containing multiple semiconductor dice from other semiconductor-device-package locations 102 in the wafer. As a more specific example, dicing saws may be used to cut through only dielectric molding material 106 of the fan out wafer 100 along streets 108 between semiconductor-device-package locations 102 to separate the semiconductor-device-package locations 102 from one another.

The first and second semiconductor dice 110 and 112 may be operatively connected to electrically conductive traces 118 of the semiconductor-device-package location 102, electrically conductive traces 118 being formed after fabrication of fan out wafer 100. The active surfaces 114 and 116 of the first and second semiconductor dice 110 and 112 may face the electrically conductive traces 118, and electrically conductive bond pads 120 on the active surfaces 114 and 116 may be electrically connected to the electrically conductive traces 118, such as, for example, by forming the electrically conductive traces 118 by a deposition and patterning process over the electrically conductive material of the bond pads 120. In some embodiments, at least some of the electrically conductive traces 118 may operatively connect the first and second semiconductor dice 110 and 112 to one another.

At least some of the electrically conductive traces 118 may extend laterally beyond peripheries of the first and second semiconductor dice 110 and 112 and over dielectric molding material 106. For example, some of the electrically conductive traces 118 may extend laterally beyond side surfaces 122 of the first and second semiconductor dice 110 and 112, such that the electrically conductive traces 118 protrude laterally from the first and second semiconductor dice 110 and 112. A lateral footprint of the electrically conductive traces 118 of the semiconductor-device-package location 102 may be greater than a lateral footprint of the first and second semiconductor dice 110 and 112.

Passivation material 124 may be located between active surfaces 114 and 116 of semiconductor dice 110 and 112 and electrically conductive traces 118 and, optionally, between electrically conductive traces 118. The electrically conductive traces 118 may form what is commonly known in the art as a "redistribution layer" serving to redistribute a pattern of external contacts provided by bond pads 120.

Electrically conductive vias 126 may extend from the electrically conductive traces 118 at locations laterally beyond the peripheries of the first and second semiconductor dice 110 and 112, through the molding material 106, at least to a plane coplanar with inactive surfaces 128 and 130 of the first and second semiconductor dice 110 and 112. The electrically conductive vias 126 may be formed by, for example, forming holes in the molding material 106 (e.g., by laser drilling) such that the holes extend from an upper surface of the molding material 106 to undersides of the electrically conductive traces 118. Electrically conductive material, for example, copper, may be deposited in the holes to form the electrically conductive vias 126 by, for example, plating (e.g., electroplating or electroless plating). The electrically conductive vias 126 may be laterally spaced from the first and second semiconductor dice 110 and 112, such that there may be molding material 106 in the space defined between the side surfaces 122 of the first and second semiconductor dice 110 and 112 and the electrically conductive vias 126. Ends of electrically conductive vias 126 may be exposed for formation of electrical connections opposite the electrically conductive traces 118.

In some embodiments, a passivation material 132 may be located at least on the inactive surfaces 128 and 130 of the first and second semiconductor dice 110 and 112, particularly if dielectric molding material 106 of fan out wafer 100 does not extend over inactive surfaces 128 and 130. More specifically, the passivation material 132 may extend over the inactive surfaces 128 and 130 and laterally around the exposed ends of the electrically conductive vias 126. A thickness $T_{PM}$ of the passivation material 132 may be less than a thickness $T_{MM}$ of the molding material 106. More specifically, the thickness $T_{PM}$ of the passivation material 132 may be less than a thickness $T_{SD}$ of at least one of the first and second semiconductor dice 110 and 112.

FIG. 3 is a cross-sectional view of the portion of the fan out wafer 100 of FIG. 2 in a first stage of a process of making a semiconductor device package. A stack of semiconductor dice may be operatively connected to at least one semiconductor-device-package location 102 on the fan out wafer 100. For example, a stack of semiconductor dice may be operatively connected to each semiconductor-device-package location 102 on the fan out wafer 100. In some embodiments, the stack of semiconductor dice may be formed by operatively connecting a plurality of vertically superimposed semiconductor dice modules 134 to at least some electrically conductive vias 126 of a respective semiconductor-device-package location 102.

Each semiconductor dice module 134 may comprise a singulated segment of another fan out wafer 100 (not shown) and include, for example, at least two semiconductor dice 136 located laterally adjacent to and spaced from one another, separated by a dielectric molding material 148. More specifically, active surfaces 138 of the semiconductor dice 136 may be at least substantially coplanar with one another. The active surfaces 138 of the semiconductor dice 136 may include integrated circuitry, such as, for example, transistors, capacitors, resistors, etc. In some embodiments, the semiconductor dice 136 may be, for example, memory devices (e.g., DRAM or NAND Flash memory).

Dielectric material, such as a dielectric molding material 148 may laterally surround the semiconductor dice 136. The dielectric molding material 148 may be a dielectric material encapsulating at least the side surfaces 144 of the semiconductor dice 136. More specifically, the dielectric molding material 148 may be formed by flowing a curable molding material precursor at least laterally around and optionally over inactive surfaces 152 of the semiconductor dice 136 of a plurality of similar semiconductor dice modules 134 in an array and curing it to form the dielectric molding material 148. The dielectric molding material 148 may initially bind the discrete semiconductor dice modules 134 together, such that they cooperatively form another fan out wafer 100. The semiconductor dice modules 134 may be formed, for example, by singulating individual semiconductor dice modules 134 from other semiconductor dice modules 134 in the fan out wafer 100. As a more specific example, saws may cut through only dielectric materials of the wafer along streets between semiconductor dice modules 134 to separate the semiconductor dice modules 134 from one another.

The semiconductor dice 136 may be operatively connected to electrically conductive traces 140 of the semiconductor dice module 134, electrically conductive traces 140 being formed after fabrication of another fan out wafer 100. The active surfaces 138 of the semiconductor dice 136 may face the electrically conductive traces 140, and electrically conductive bond pads 142 on the active surfaces 138 may be electrically connected to the electrically conductive traces 140, such as, for example, by forming the electrically conductive traces 140 by a deposition and patterning process over the electrically conductive material of the bond pads 142. In some embodiments, at least some of the electrically conductive traces 140 may operatively connect the semiconductor dice 136 to one another.

At least some of the electrically conductive traces 140 may extend laterally beyond peripheries of the semiconductor dice 136. For example, some of the electrically conductive traces 140 may extend laterally beyond side surfaces 144 of the semiconductor dice 136 and over dielectric molding material 148, such that the electrically conductive traces 140 protrude laterally from the semiconductor dice 136. A lateral footprint of the electrically conductive traces 140 of the semiconductor dice module 134 may be greater than a lateral footprint of the semiconductor dice 136.

Passivation material 146 may be located over active surfaces 138 of semiconductor dice 136 and, optionally, laterally adjacent to the electrically conductive traces 140. The electrically conductive traces 140 may form a redistribution layer for electrically conductive bond pads 142. The active surfaces 138 of the semiconductor dice 136 of one or more semiconductor dice modules 134 may face the same direction as the active surfaces 114 and 116 of the first and second semiconductor dice 110 and 112 of the associated semiconductor-dice-package location 102.

Electrically conductive vias 150 may extend from the electrically conductive traces 140 at locations laterally beyond the peripheries of the semiconductor dice 136, through the dielectric molding material 148, at least to a plane coplanar with inactive surfaces 152 of the semiconductor dice 136. The electrically conductive vias 150 may be formed by, for example, forming holes in the molding material 148 (e.g., by laser drilling) such that the holes extend from an upper surface of the dielectric molding material 148 to undersides of the electrically conductive traces 140. Electrically conductive material, for example, copper, may be deposited in the holes to form the electrically conductive vias 150 by, for example, plating (e.g., electroplating or electroless plating). The electrically conductive vias 150 may be laterally spaced from the semiconductor dice 136, such that there may be dielectric molding material 148 in the space defined between the side surfaces 144 of the semiconductor dice 136 and the electrically conductive vias 150. Ends of electrically conductive vias 150 may be exposed for formation of electrical connections opposite the electrically conductive traces 140.

In some embodiments, a passivation material 154 may be located at least on the inactive surfaces 152 of the semiconductor dice 136 particularly if dielectric molding material 148 does not extend over inactive surfaces 152. More specifically, the passivation material 154 may extend over the inactive surfaces 152 and laterally around the exposed ends of the electrically conductive vias 150. A thickness $T_{PM}$ of the passivation material 154 may be less than a thickness $T_{MM}$ of the molding material 148. More specifically, the thickness $T_{PM}$ of the passivation material 154 may be less than a thickness $T_{SD}$ of at least one of the semiconductor dice 136.

Such semiconductor dice modules 134 may be operatively connected to a semiconductor-device-package location 102 of the fan out wafer 100 by aligning vias 150 of the semiconductor device module 134 with underlying vias 126 of the semiconductor-device-package location 102 and electrically connecting the vias 126 and 150 to one another, for example, by thermocompression bonding or solder reflow. In some embodiments, side surfaces 122 of the first and second semiconductor dice 110 and 112 may be aligned (e.g., at least substantially coplanar) with side surfaces 144 of the semiconductor dice 136 of the semiconductor dice module 134, although such an alignment is not required or necessarily desirable.

Figure 4:
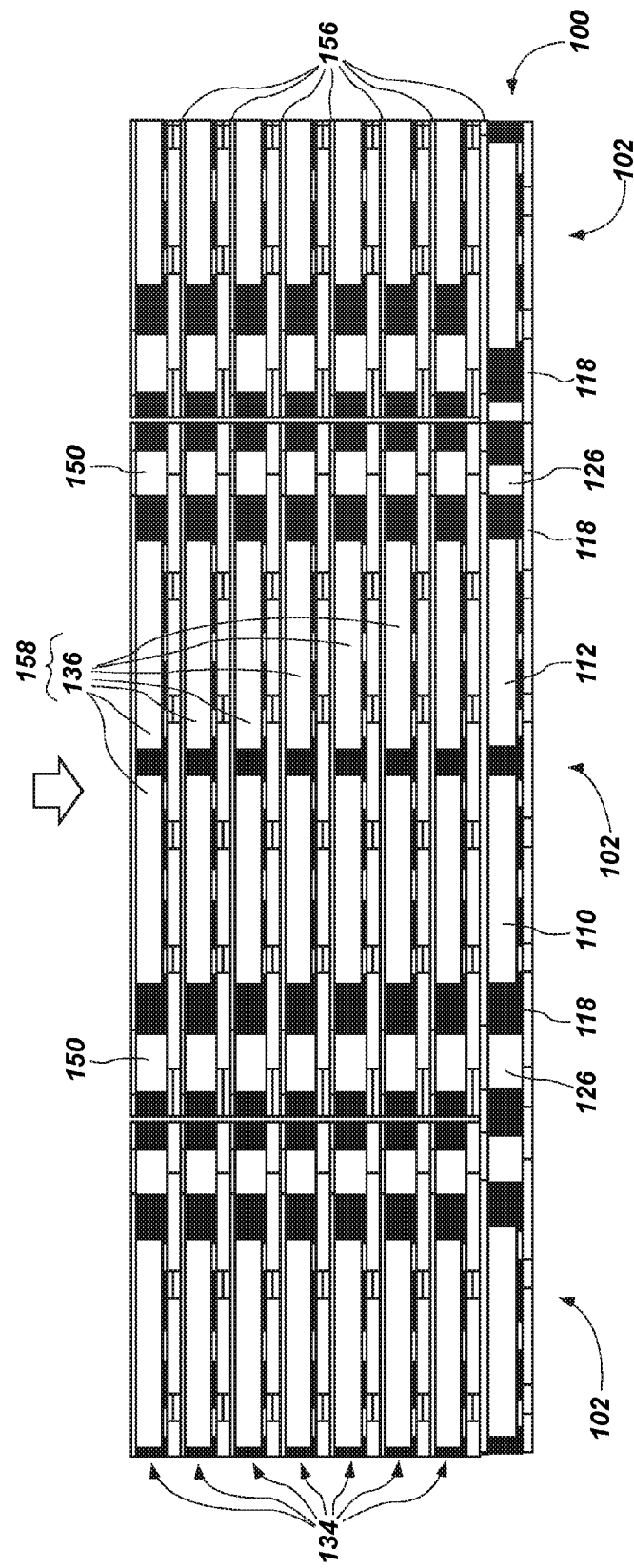
FIG. 4 is a cross-sectional view of the portion of the fan out wafer of FIG. 2 in a subsequent stage of the process of making a semiconductor device package.

FIG. 4 is a cross-sectional view of the portion of the fan out wafer 100 of FIG. 2 in a subsequent stage of the process of making a semiconductor device package. A plurality of the semiconductor dice modules 134 has been positioned over, and operatively connected to, the semiconductor-device-package location 102 of the fan out wafer 100 to form a stack 158 of semiconductor dice 136 on a side of the semiconductor-device-package location 102 opposite the electrically conductive traces 118 of the semiconductor-device-package location 102. A total number of semiconductor dice 136 in the stack 158 of semiconductor dice 136 (i.e., semiconductor dice 136 other than the first and second semiconductor dice 110 and 112 of the associated semiconductor-device-package location 102 of the fan out wafer 100) may be, for example, two, four, six, eight, ten, twelve, fourteen, sixteen, or more.

In some embodiments, an adhesive or other dielectric material 156 may be positioned between the semiconductor-device-package location 102 and the adjacent semiconductor dice module 134, as well as between adjacent semiconductor dice modules 134. For example, nonconductive paste or nonconductive film (e.g., a dielectric underfill material) may be positioned between the semiconductor-device-package location 102 and the adjacent semiconductor dice module 134 and other semiconductor dice modules 134 in stack 158 and around the connections between vias 126 and 150 and vias 126 in stack 158. In other embodiments, there may not be any dielectric material 156 between the semiconductor-device-package location 102 and the semiconductor dice module 134, or between adjacent semiconductor dice modules 134. Omitting the dielectric material 156 may reduce an overall height of a resulting semiconductor device package, in addition to reducing component damage and thermal management problems frequently associated with dielectric materials used to electrically isolate and mutually bond semiconductor dice.

The semiconductor dice modules 134 may be physically secured and operatively connected to one another and to the associated semiconductor-device-package location 102 by exposing the stack 158 of semiconductor dice modules 134 and the fan out wafer 100 to an elevated temperature while applying pressure to the stack 158 of semiconductor dice 136. Heating the semiconductor dice modules 134 may cause, for example, flowable, electrically conductive material (e.g., solder) between adjacent electrically conductive vias 126 and 150 and adjacent vias 126 to reflow and form an electrical connection, or electrically conductive material (e.g., copper or gold) of adjacent electrically conductive vias 126 and 150 and adjacent vias 126 may be caused to fuse and form an electrical connection.

Figure 5:
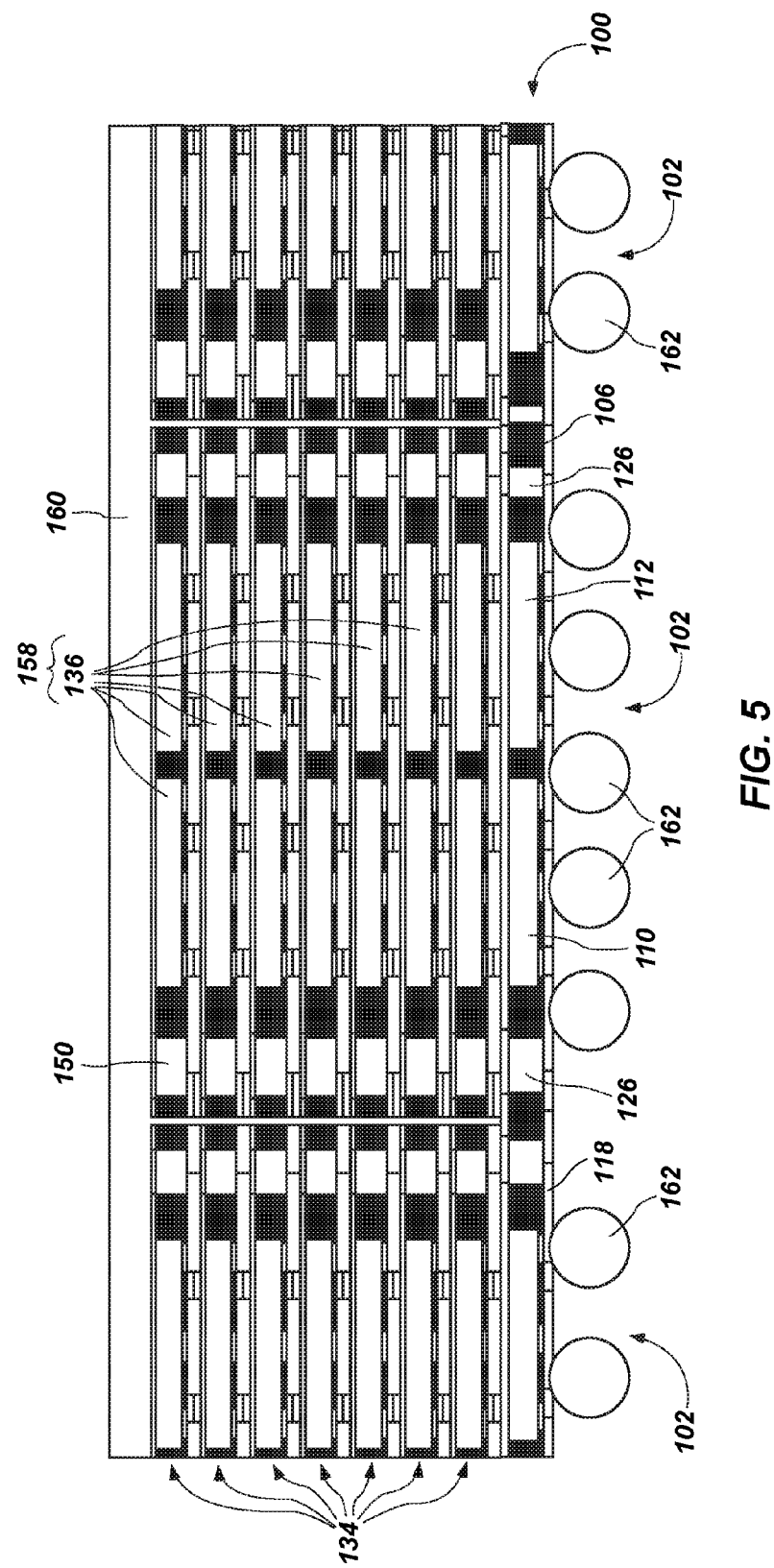
FIG. 5 is a cross-sectional view of the portion of the fan out wafer of FIG. 2 in another subsequent stage of the process of making a semiconductor device package.

FIG. 5 is a cross-sectional view of the portion of the fan out wafer 100 of FIG. 2 in another subsequent stage of the process of making a semiconductor device package. In some embodiments, such as that shown in FIG. 5, a dielectric overmold material 160 may be disposed on a side of stacks 158 of semiconductor dice 136 comprising semiconductor dice modules 134 opposite the locations 102 of paired first and second semiconductor dice 110 and 112 of fan out wafer 100 in a wafer level encapsulation process. The overmold material 160 may be, for example, a material that has been cured after flowing the material over the exposed top surfaces of the topmost semiconductor dice module 134. In some embodiment, where stacks 158 of semiconductor dice 136 adjacent semiconductor dice modules 134 are sufficiently laterally spaced, dielectric overmold material may also be disposed between stacks 158. In other embodiments, the dielectric overmold material 160 may be omitted.

Conductive elements 162 of an electrically conductive material for connection to higher-level packaging may be physically and electrically connected to the electrically conductive traces 118 of the fan out wafer 100 on a side of the fan out wafer 100 opposite the stack 158 of semiconductor dice 136. The conductive elements 162 may be configured to physically secure and operatively connect to another device or structure. The conductive elements 162 may be configured as, for example, bumps, balls, columns, or pillars of a flowable, electrically conductive material (e.g., solder). The conductive elements 162 may be positioned in repeating patterns at locations on the fan out wafer 100 corresponding to locations of ends of at least some of the electrically conductive traces 118.

Figure 6:
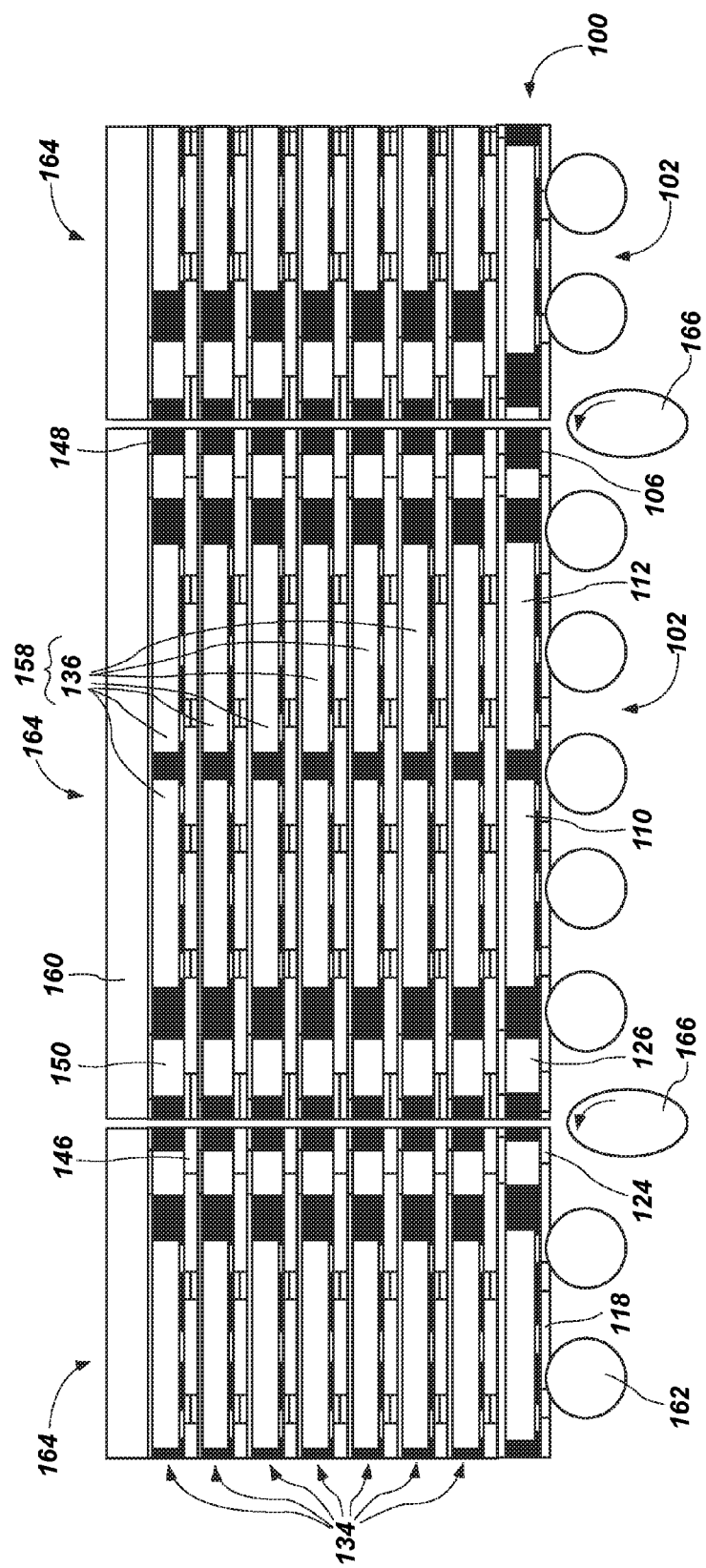
FIG. 6 is a cross-sectional view of the portion of the fan out wafer of FIG. 2 in a final stage of the process of making a semiconductor device package.

FIG. 6 is a cross-sectional view of the portion of the fan out wafer 100 of FIG. 2 in a final stage of the process of making a semiconductor device package 164. Each semiconductor-device-package location 102 of the fan out wafer 100 may be separated, or "singulated," from each other semiconductor-device-package location 102 mutually bound together only by common dielectric molding material 106 and, in some embodiments, through dielectric overmold material 160. For example, a cutting apparatus in the form of saw 166 may cut through only dielectric material (e.g., only through the molding material 106 and the dielectric overmold material 160 or only through the molding material 106 of the respective semiconductor-device-package locations 102, the dielectric overmold material 160, any molding material 148 of any semiconductor dice modules 134, and any passivation material 124 and 146 of the respective semiconductor-device-package location 102 and any semiconductor dice modules 134) at a lateral distance from the vias 126 of each semiconductor-device-package location 102 and between adjacent semiconductor-device-package locations 102. Notably, such cutting may be effected from the active side of the first and second semiconductor dice 110 and 112 by cutting between the stacks 158 in a direction away from conductive elements 162 and toward topmost semiconductor dice 136 in stacks 158 only through dielectric material, significantly reducing any stress on the semiconductor dice 110, 112, and 136 and on the conductive elements 162.

Figure 7:
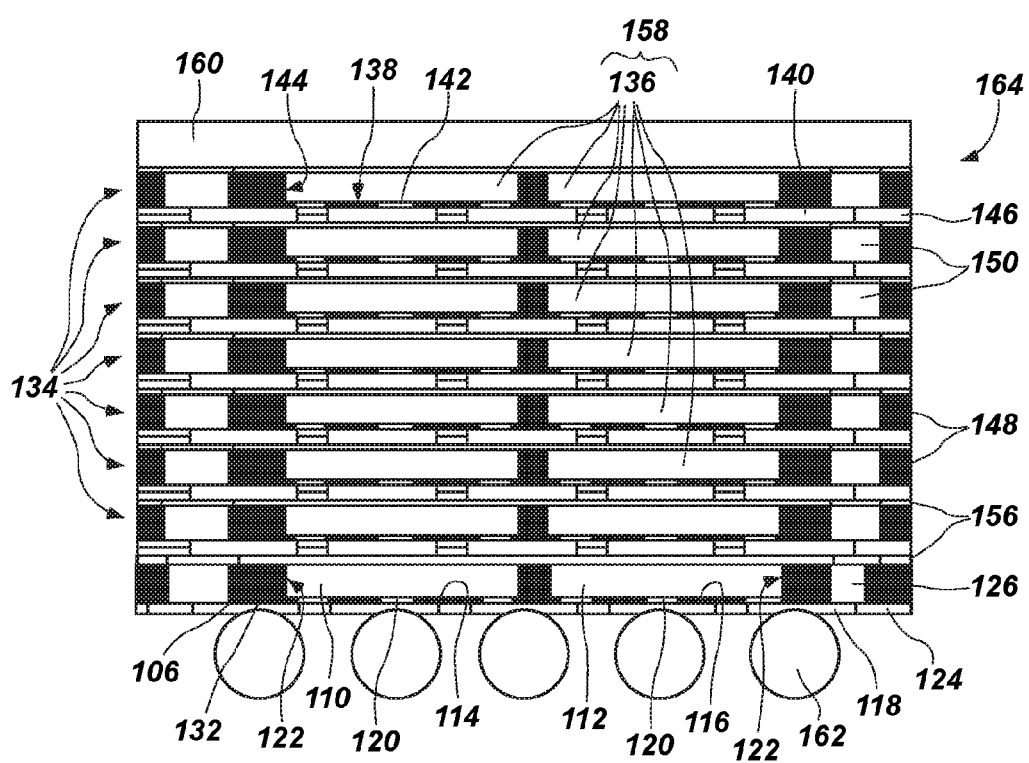
FIG. 7 is a cross-sectional view of a semiconductor device package produced by the process of FIGS. 3 through 6.

Such an approach contrasts favorably with the cutting stress applied directly to a conventional base semiconductor wafer having stacks of additional encapsulated semiconductor dice thereon. When singulating each semiconductor-device-package location 102 from each other semiconductor-device-package location 102, the saw 166 may not cut through or otherwise contact semiconductor material of any of the semiconductor dice 110, 112, and 136 or electrically conductive material of the fan out wafer 100 and semiconductor dice modules 134. Separating each semiconductor-device-package location 102 from each other semiconductor-device-package location 102 may involve removing a portion of the molding material 106 proximate a lateral periphery of the respective semiconductor-device-package location 102. Another portion of the molding material 106 may remain between the electrically conductive vias 126 and a lateral periphery of the resulting semiconductor device package 164, which may better protect the embedded semiconductor dice 110, 112, and 136 and electrical connections therebetween during subsequent handling when compared to conventional, wafer-level processed semiconductor device packages. FIG. 7 is a cross-sectional view of a semiconductor device package 164 produced by the process of FIGS. 3 through 6.

In yet another embodiment, semiconductor device package 164 may be fabricated as described above, with the exception that a fan out wafer comprising semiconductor dice modules 134 each comprising multiple semiconductor dice 136 may be stacked on a base fan out wafer 100 comprising die locations 102 (see FIG. 1), each including first semiconductor die and a second semiconductor die, for example, a logic die 110 and a power die 112. By constructing the fan out wafer comprising memory modules 134 with via locations 150 corresponding to via locations 126, stacking may be effected at wafer level, followed by electrical connection of the semiconductor dice 136 in each stack to semiconductor dice 110 and 112 of each associated die location through vias 126 and 150 by, for example, thermocompression bonding. Dielectric overmolding may then take place, followed by attach of conductive elements 162, and then singulation.

In other words, methods of making semiconductor device packages may involve providing a fan out wafer comprising semiconductor-device-package locations. Each semiconductor-device-package location may include at least two mutually spaced semiconductor dice and a dielectric material laterally surrounding each of the at least two mutually spaced semiconductor dice and extending between adjacent semiconductor-device-package locations. Electrically conductive traces may extend over active surfaces of the at least two semiconductor dice and laterally beyond peripheries of the at least two semiconductor dice over the dielectric material to locations of electrically conductive vias extending from the electrically conductive traces through the dielectric molding material. Semiconductor dice may be stacked on a side of at least some semiconductor-device-package locations of the fan out wafer opposite the electrically conductive traces. The stacks of semiconductor dice may be electrically connected to electrically conductive vias of the at least some semiconductor-device-package locations. The semiconductor-device-package locations having stacks of semiconductor dice thereon may be singulated from the fan out wafer.

Figure 8:
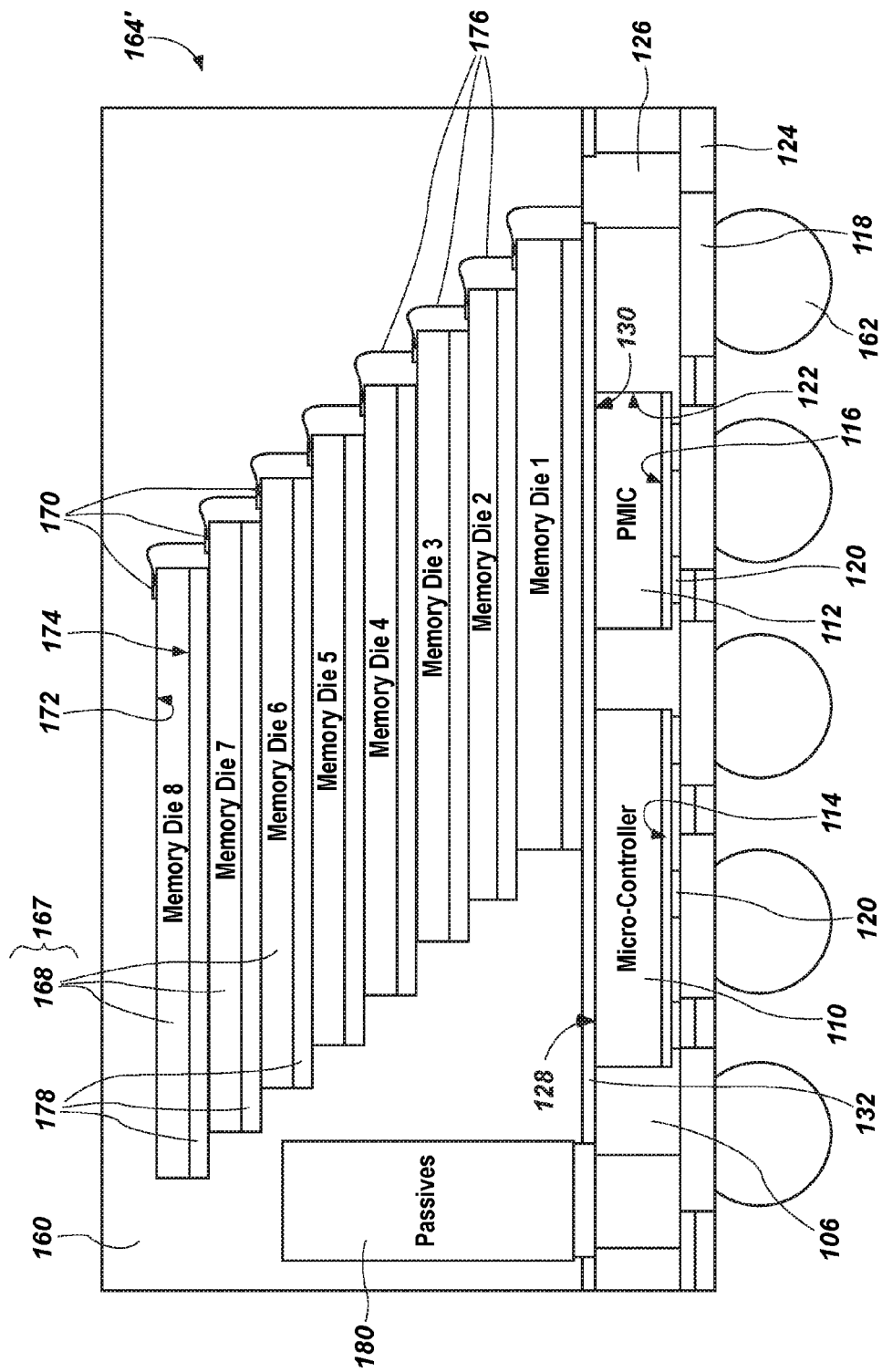
FIG. 8 is a cross-sectional view of another embodiment of a semiconductor device package.

FIG. 8 is a cross-sectional view of another embodiment of a semiconductor device package 164'. The semiconductor device package 164' may include at least a first semiconductor die 110 and a second semiconductor die 112 laterally adjacent to the first semiconductor die 110. More specifically, an active surface 114 of the first semiconductor die 110 may be at least substantially coplanar with an active surface 116 of the second semiconductor die 112. The active surfaces 114 and 116 of the first and second semiconductor dice 110 and 112 may include integrated circuitry, such as, for example, transistors, capacitors, resistors, etc. In some embodiments, the first semiconductor die 110 may be, for example, a logic device (e.g., a micro-controller), and the second semiconductor die 112 may be, for example, a power management device. In other embodiments, one or both of the first and second semiconductor dice 110 and 112 may be memory devices (e.g., DRAM or NAND Flash memory).

The first and second semiconductor dice 110 and 112 may be operatively connected to a redistribution layer comprising electrically conductive traces 118 of the semiconductor device package 164'. The active surfaces 114 and 116 of the first and second semiconductor dice 110 and 112 may face the electrically conductive traces 118, and electrically conductive bond pads 120 on the active surfaces 114 and 116 may be electrically connected to the electrically conductive traces 118. In some embodiments, at least some of the electrically conductive traces 118 may operatively connect the first and second semiconductor dice 110 and 112 to one another. Dielectric molding material 106 may laterally surround the first and second semiconductor dice 110 and 112. The dielectric molding material 106 may be a dielectric material encapsulating at least the side surfaces 122 of the first and second semiconductor dice 110 and 112 and, optionally, inactive surfaces 128 and 130 thereof opposing active surfaces 114 and 116.

At least some of the electrically conductive traces 118 may extend laterally beyond peripheries of the first and second semiconductor dice 110 and 112 and over dielectric molding material 106. For example, some of the electrically conductive traces 118 may extend laterally beyond side surfaces 122 of the first and second semiconductor dice 110 and 112, such that the electrically conductive traces 118 protrude laterally from the first and second semiconductor dice 110 and 112 (see FIG. 2). A lateral footprint of the electrically conductive traces 118 of the semiconductor-device-package location 102 (see FIG. 1) may, consequently, be greater than a lateral footprint of the first and second semiconductor dice 110 and 112.

Passivation material 124 may be located over active surfaces 114 and 116 of semiconductor dice 110 and 112 and, optionally, laterally adjacent to the electrically conductive traces 118. Electrically conductive vias 126, for example, of copper, may extend from and perpendicular to the electrically conductive traces 118 through dielectric molding material 106 at locations laterally beyond the peripheries of the first and second semiconductor dice 110 and 112 at least to a plane coplanar with inactive surfaces 128 and 130 of the first and second semiconductor dice 110 and 112. The electrically conductive vias 126 may be laterally spaced from the first and second semiconductor dice 110 and 112, such that there may be molding material 106 in the space defined between the side surfaces 122 of the first and second semiconductor dice 110 and 112 and the electrically conductive vias 126.

In some embodiments, a passivation material 132, particularly where dielectric molding material 106 does not extend over inactive surfaces 128 and 130 of semiconductor dice 110 and 112, may be located at least on the inactive surfaces 128 and 130 of the first and second semiconductor dice 110 and 112. More specifically, the passivation material 132 may extend laterally around the upper ends of the electrically conductive vias 126.

A stack 167 of semiconductor dice 168 may be operatively connected to the first and second semiconductor dice 110 and 112. The stack 167 of semiconductor dice 168 may include a plurality of adjacent, mutually partially laterally offset semiconductor dice 168. In some embodiments, each semiconductor die 168 of the stack 167 may include bond pads 170 located along a single side of the semiconductor die 168. In some embodiments, successive semiconductor die 168 may be laterally offset from an adjacent underlying semiconductor die 168 to an extent sufficient that the bond pads 170 of each semiconductor die 168 remain exposed to one side of a footprint of any overlying semiconductor dice 168. During fabrication of the semiconductor device package 164', the bond pads 170 of the semiconductor dice 168 of the stack 167 may be exposed adjacent to peripheries of adjacent semiconductor dice 168 of the stack 167 to an extent sufficient to enable wire bonding.

Active surfaces 172 of the semiconductor dice 168 may face away from the first and second semiconductor dice 110 and 112 in some embodiments. In other words, inactive surfaces 174 of the semiconductor dice 168 may be located closer to the first and second semiconductor dice 110 and 112 than the active surfaces 172. The active surfaces 172 of the second semiconductor dice 168 may include integrated circuitry, such as, for example, transistors, capacitors, resistors, etc. In some embodiments, the semiconductor dice 168 may be, for example, memory devices (e.g., DRAM or NAND Flash memory).

The semiconductor dice 168 of the stack 167 may be operatively connected to the first and second semiconductor dice 110 and 112 by wire bonds 176 that may extend between bond pads 170 of adjacent semiconductor dice 168 and from bond pads 170 of a bottommost semiconductor die 168 of the stack 167 to at least some of the electrically conductive vias 126 on a first lateral side of the semiconductor device package 164'. For example, the wire bonds 176 may be located laterally closer to the second semiconductor die 112 than they are to the first semiconductor die 110.

A passivation material 178 may be located between adjacent semiconductor dice 168 of the stack 167 and between a bottommost semiconductor die 168 of the stack 167 and the first and second semiconductor dice 110 and 112. There may not be any adhesive or other dielectric material other than passivation material 178 between the first and second semiconductor dice 110 and 112 and the stack 167 of semiconductor dice 168, or between adjacent semiconductor dice 168. Omitting such adhesive or other dielectric material may reduce an overall height of a resulting semiconductor device package, in addition to reducing component damage and thermal management problems frequently associated with adhesive materials used to bond stacked semiconductor dice.

In some embodiments, one or more passive components 180 may be operatively connected to the first and second semiconductor dice 110 and 112 within the semiconductor device package 164'. For example, at least one of a resistor, a capacitor, an inductor, or another passive component 180 may be operatively connected to the first and second semiconductor dice 110 and 112. The passive components 180 may be located on a side of the stack 167 of semiconductor dice 168 opposite the wire bonds 176 in some embodiments, and be located over and connected to one or more vias 126 prior to stacking semiconductor dice 168. For example, the passive components 180 may be directly electrically connected to vias 126 laterally adjacent to the first and second semiconductor dice 110 and 112 on a side of stack 167 opposite the wire bonds 176.

A dielectric overmold material 160 may be disposed over the stack 167 of semiconductor dice 168 and around the wire bonds 176 in a wafer-level encapsulation process employed to encapsulate a plurality of stacks 167 semiconductor dice on semiconductor-device-package locations 102. The dielectric overmold material 160 may be, for example, a material that has been cured after flowing the material over and around the exposed surfaces of the passivation material 132 (if present), the passive components 180, the stack 167 of semiconductor dice 168, the wire bonds 176, the passivation material 178, and the vias 126.

Semiconductor device packages 164' such as that shown in FIG. 8 may be formed in a manner similar to the process shown in FIGS. 3 through 6. Stacks 167 of semiconductor dice 168 may be positioned on semiconductor-device-package locations 102 (see FIGS. 3, 4) of a fan out wafer 100 (see FIGS. 1, 2), each semiconductor-device-package location 102 comprising semiconductor dice 110 and 112. Wire bonds 176 may be formed to operatively connect the semiconductor dice 168 of each stack 167 to at least some of the vias 126 on a first side of a semiconductor-device-package location 102 (see FIGS. 3, 4). Passive components 180 may be operatively connected to the vias 126 on a second, opposite side of each semiconductor-device-package location 102 (see FIGS. 3, 4). Dielectric overmold material 160 may be disposed over and around the exposed surfaces of the passivation material 132 (if present), the passive components 180, the stack 167 of semiconductor dice 168, the wire bonds 176, the passivation material 178, and the vias 126, and electrically conductive elements 162 operatively connected to electrically conductive traces 118 at distal ends thereof. Finally, each semiconductor device package 164' may be singulated from each other semiconductor device package 164'.

When singulating each semiconductor device package 164' from each other semiconductor device package 164', the saw 166 (see FIG. 6) may not cut through or otherwise contact semiconductor material of any of the semiconductor dice 110, 112, and 168 or electrically conductive material of the fan out wafer 100 (see FIGS. 1, 2) and stack 167 of semiconductor dice 168. Separating each semiconductor device package 164' from each other semiconductor device package 164' may involve cutting only through dielectric overmold material 160 and through a portion of the dielectric molding material 106 proximate a lateral periphery of the respective semiconductor-device-package location 102 (see FIGS. 1, 2). As depicted in and described with respect to FIG. 6, cutting may be effected from a side of fan out wafer 100 proximate electrically conductive elements 162 so that all applied stress from the saw 166 acts on dielectric molding material 106 and dielectric overmold material 160. Another portion of the dielectric molding material 106 may remain between the electrically conductive vias 126 and a lateral periphery of the resulting semiconductor device package 164', which may better protect the embedded semiconductor dice 110 and 112 and electrical connections therebetween during subsequent handling when compared to conventional, wafer-level processed semiconductor device packages.

In other words, semiconductor device packages may include a base level having at least a first semiconductor die and a second semiconductor die spaced therefrom. Each of the at least a first and a second semiconductor dice may be laterally surrounded and mutually secured by a dielectric material. Electrically conductive traces may extend over active surfaces of each of the at least a first semiconductor die and a second semiconductor die, the electrically conductive traces extending laterally beyond peripheries of the at least a first and a second semiconductor dice and over the dielectric material to locations of conductive vias extending through the molded dielectric material. Such semiconductor device packages may further include a stack of semiconductor dice modules, each semiconductor dice module comprising spaced semiconductor dice laterally surrounded and mutually secured by a dielectric material, electrically conductive traces extending over active surfaces of the semiconductor dice of the semiconductor dice module and over the dielectric material to locations of conductive vias extending through the dielectric material. Vias of the semiconductor dice modules of the stack may be mutually vertically superimposed and vertically superimposed with vias of the base level and vias extending from semiconductor traces are electrically connected to semiconductor traces extending from a vertically adjacent semiconductor die.

In additional embodiments, semiconductor device packages may include a base level comprising multiple, mutually laterally spaced semiconductor dice. Each semiconductor die may be laterally surrounded and mutually secured by a dielectric material. Electrically conductive traces may extend over active surfaces of each of the multiple semiconductor dice and extend laterally beyond peripheries of the multiple, mutually laterally spaced semiconductor dice and over the dielectric material to locations of conductive vias extending through the dielectric material. A stack of semiconductor dice may be located on a side of the base level opposite the electrically conductive traces. Semiconductor dice of the stack of semiconductor dice may be partially laterally offset from one another. Electrically conductive wire bonds may electrically connect bond pads on active surfaces of the semiconductor dice of the stack of semiconductor dice to the electrically conductive vias.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventor.

What is claimed is:

1. A method of fabricating a semiconductor device package, comprising:
    providing a fan out wafer comprising semiconductor-device-package locations at a base level, each semiconductor-device-package location comprising:
        at least two mutually spaced semiconductor dice and a dielectric material laterally surrounding each of the at least two mutually spaced semiconductor dice and extending between adjacent semiconductor-device-package locations; and
        electrically conductive traces extending over active surfaces of the at least two semiconductor dice and laterally beyond peripheries of the at least two semiconductor dice over the dielectric material to locations of electrically conductive vias extending from the electrically conductive traces through the dielectric material;
    stacking laterally offset semiconductor dice on at least some semiconductor-device-package locations of the fan out wafer to expose bond pads at a lateral periphery of each of the laterally offset semiconductor dice;
    electrically connecting the laterally offset semiconductor dice to one another and associated electrically conductive traces of the at least some semiconductor-device-package locations by forming wire bonds extending from a respective bond pad of an overlying semiconductor die of the laterally offset semiconductor dice to an adjacent bond pad of an underlying semiconductor die of the laterally offset semiconductor dice and by forming a wire bond extending from a respective bond pad of a lowest semiconductor die of the laterally offset semiconductor dice to an adjacent via of the electrically conductive vias or to an adjacent trace of the electrically conductive traces; and
    singulating the semiconductor-device-package locations having stacks of semiconductor dice thereon from the fan out wafer.

2. The method of claim 1, wherein stacking the laterally offset semiconductor dice to expose the bond pads at the lateral periphery of each of the laterally offset semiconductor dice comprises exposing the bond pads at the lateral periphery on only one lateral end of the laterally offset semiconductor dice.

3. The method of claim 1, wherein forming the wire bond extending from the respective bond pad of the lowest semiconductor die of the laterally offset semiconductor dice to the adjacent via or to the adjacent trace comprises forming the wire bond extending from the respective bond pad of the lowest semiconductor die of the laterally offset semiconductor dice to the adjacent via from which an electrically conductive trace of the electrically conductive traces extends to a respective one of the at least two mutually spaced semiconductor dice.

4. The method of claim 1, further comprising stacking each semiconductor die of the stacks of semiconductor dice with an active surface facing away from the at least two mutually spaced semiconductor dice of the at least some semiconductor-device-package locations.

5. The method of claim 1, further comprising electrically connecting at least one passive component to at least one other electrically conductive via of the electrically conductive vias on a side of each of the at least some semiconductor-device-package locations opposite the side to which the wire bonds are electrically connected to vias thereof.

6. The method of claim 1, further comprising disposing a dielectric overmold material over the stacks of semiconductor dice and around the wire bonds.

7. The method of claim 1, further comprising disposing a passivation material between each overlying semiconductor die and each corresponding underlying semiconductor die and between the lowest semiconductor die of each of the stacks of semiconductor dice and the fan out wafer.

8. The method of claim 1, further comprising electrically connecting electrically conductive elements directly to the electrically conductive traces of the at least one semiconductor-device-package location, the electrically conductive elements being configured to physically and electrically connect the semiconductor device package to higher level packaging.

9. The method of claim 1, wherein singulating the at least one semiconductor-device-package location from the fan out wafer comprises cutting through only one or more dielectric materials.

10. The method of claim 1, wherein providing the fan out wafer comprising semiconductor-device-package locations at the base level, each semiconductor-device-package location comprising the at least two mutually spaced semiconductor dice, comprises providing the fan out wafer comprising semiconductor-device-package locations at the base level, each semiconductor-device-package location comprising a logic device and a power management device operatively connected to, and laterally spaced from, the logic device.

11. The method of claim 10, wherein stacking the laterally offset semiconductor dice on the at least some semiconductor-device-package locations of the fan out wafer comprises stacking laterally offset memory devices on the at least some semiconductor-device-package locations of the fan out wafer.

12. The method of claim 10, wherein forming the wire bond extending from the respective bond pad of the lowest semiconductor die of the laterally offset semiconductor dice to the adjacent via of the electrically conductive vias or to the adjacent trace of the electrically conductive traces comprises forming the wire bond laterally closer to the power management device than to the logic device.

13. A semiconductor device package, comprising:
   a base level comprising:
      a logic device and a power management device laterally spaced from, and operatively connected to, the logic device, the logic device and the power management device laterally surrounded and mutually secured by a dielectric material; and
      electrically conductive traces over active surfaces of each of the logic device and the power management device extending laterally beyond peripheries of the logic device and the power management device and over the dielectric material to locations of electrically conductive vias extending through the dielectric material; and
   a stack of memory devices located on the base level, memory devices of the stack of memory devices being partially laterally offset from one another, an electrically conductive wire bond extending from each respective bond pad exposed at a lateral periphery of each active surface of each overlying memory device to a corresponding bond pad exposed at a lateral periphery of each active surface of a corresponding underlying memory device of the stack of memory devices, an electrically conductive wire bond extending from a bond pad exposed at a lateral periphery of an active surface of a lowermost memory device of the stack of memory devices to an electrically conductive via.

14. The semiconductor device package of claim 13, further comprising electrically conductive elements directly secured and electrically connected to the electrically conductive traces on a side of the electrically conductive traces opposite multiple, mutually spaced semiconductor dice.

15. The semiconductor device package of claim 14, wherein bond pads on active surfaces of each semiconductor die of the stack of memory devices are located laterally beyond peripheries of an adjacent, higher semiconductor die of the stack of memory devices, the bond pads being located along only one side of each semiconductor die of the stack of memory devices, the active surface of each memory device of the stack of memory devices facing away from the logic device and the power management device.

16. The semiconductor device package of claim 13, further comprising at least one passive component electrically connected to at least one other electrically conductive via of the electrically conductive vias on a side of at least one semiconductor-device-package location opposite the side to which the wire bonds are electrically connected.

17. The semiconductor device package of claim 16, wherein the at least one passive component is located on a lateral side of the stack of memory devices opposite a lateral side at which the bond pads are exposed.

18. The semiconductor device package of claim 13, further comprising a dielectric overmold material located over the stack of semiconductor dice, around the wire bonds and in contact with the base level.

19. The semiconductor device package of claim 13, wherein the wire bonds are located laterally closer to the power management device than to the logic device.

20. The semiconductor device package of claim 13, further comprising a passivation material located between each overlying memory device and each corresponding underlying memory device and between the lowest memory device of the stack of memory devices and the base level.

\* \* \* \* \*